(12) United States Patent
Wang

(10) Patent No.: US 7,515,465 B1
(45) Date of Patent: Apr. 7, 2009

(54) STRUCTURES AND METHODS TO STORE INFORMATION REPRESENTABLE BY A MULTIPLE BIT BINARY WORD IN ELECTRICALLY ERASABLE, PROGRAMMABLE READ-ONLY MEMORIES (EEPROM)

(75) Inventor: Lee Wang, Diamond Bar, CA (US)

(73) Assignee: FlashSilicon Incorporation, Diamond Bar, CA (US)

( * ) Notice: Subject to any disclaimer, the term of this patent is extended or adjusted under 35 U.S.C. 154(b) by 278 days.

(21) Appl. No.: 11/449,223

(22) Filed: Jun. 7, 2006

(51) Int. Cl.
 *G11C 16/04* (2006.01)
(52) U.S. Cl. .................. 365/185.03; 365/185.05; 365/185.19; 365/185.29; 257/315
(58) Field of Classification Search .......... 365/185.03, 365/185.05, 185.19, 185.24, 185.26, 185.29, 365/148; 257/315
See application file for complete search history.

(56) References Cited

U.S. PATENT DOCUMENTS

| | | | |
|---|---|---|---|
| 6,212,100 B1 * | 4/2001 | Choi | 365/185.14 |
| 6,982,903 B2 * | 1/2006 | Bertin et al. | 365/163 |
| 7,099,192 B2 * | 8/2006 | Wang et al. | 365/185.1 |

* cited by examiner

*Primary Examiner*—Tuan T Nguyen
*Assistant Examiner*—Toan Le
(74) *Attorney, Agent, or Firm*—Haynes & Boone, LLP

(57) ABSTRACT

Innovative structures and methods to store information capable of being represented by an n-bit binary word in electrically erasable Programmable Read-Only memories (EEPROM) are disclosed. To program a state below the highest threshold voltage for an N-type Field Effect Transistor (NFET) based EEPROM, the stored charge in the floating gate for the highest threshold voltage is erased down to the desired threshold voltage level of the EEPROM by applying an appropriate voltage to the control gate and drain of the NFET. The erase-down uses drain-avalanche-hot hole injection (DAHHI) for the NFET memory device to achieve the precise threshold voltage desired for the NFET EEPROM device. The method takes advantage of the self-convergent mechanism from the DAHHI current in the device, when the device reaches a steady state. For a "READ" operation, a read voltage is applied to the control gate and the drain is connected by a current load to the positive voltage supply. Using the distinctive threshold voltage associated with the different stored charges, the output voltage from the drain is distinctively recognized and converted back to the original n-bit word. A similar method for a PFET EEPROM is also disclosed.

12 Claims, 23 Drawing Sheets

|  | $B_1$ | $B_2$ | ......... | $B_{\log_2(n+1)-1}$ | $B_{\log_2(n+1)}$ |
|---|---|---|---|---|---|
| $P_0$ | 1 | 1 | ......... | 1 | 1 |
| $P_1$ | 0 | 1 | ......... | 1 | 1 |
|  |  |  |  |  |  |
| $P_{n-1}$ | 0 | 0 | ......... | 0 | 1 |
| $P_n$ | 0 | 0 | ......... | 0 | 0 |

FIG. 8

STRUCTURES AND METHODS TO STORE INFORMATION REPRESENTABLE BY A MULTIPLE BIT BINARY WORD IN ELECTRICALLY ERASABLE, PROGRAMMABLE READ-ONLY MEMORIES (EEPROM)

BACKGROUND OF THE INVENTION

1. Field of the Invention

The invention relates to an Electrically Erasable Programmable Read-Only Memory (EEPROM), and more specifically, to structures and methods for enabling multiple threshold voltage operation in single EEPROM cell.

2. Description of the Prior Art

Semiconductor non-volatile memory (NVM), and particularly electrically erasable, programmable read-only memory (EEPROM), is used in a range of electronic equipment from computers, to telecommunications hardware, to consumer appliances, and to subscriber identity modules (SIMs) for mobile phones. In general, EEPROMs serve a niche in the NVM space as a mechanism for storing firmware and data that can be kept even with power off and yet can be altered as needed. The flash EEPROM may be regarded as a specifically configured EEPROM that may be erased only on a global or sector-by-sector basis.

As is well known to those skilled in the art and as shown in FIGS. 1a~1e and 2a~2e, EEPROM cells with drain/source regions 1a, 1b, 1d, 1g, 13c, 13f and 2a, 2b, 2d, 2g, 9c, 9f, formed by ion implantation, are typically constructed by forming a field effect transistor (FET) in a body of semiconductor material (such as P-substrate or P-well 1e, 1c, 3d or N-substrate or N-well 1f, 2f, 3f), usually silicon. In one configuration, shown in FIGS. 1a and 2a, the FET can be made to store electrical charge in an insulated polysilicon gate electrode 4a or 4b, referred to as a floating gate 4a or 4b, separated from the underlying substrate 1e or 1f and the drain/source regions 1a and 2a or 1b and 2b by bottom oxide layer 3a or 3b and from an overlying gate conductor 6a or 6b by a top oxide layer 5a or 5b. Besides this typical cell architecture, there are also varieties of device cells. For example, in the semiconductor-oxide-nitride-oxide-semiconductor (SONOS) NVM cell architecture, shown in FIG. 1b (2b)(hereinafter, to eliminate redundancy, the numbers in parentheses refer to the elements in the Figure the number of which is in parenthesis), the gate structure includes an oxide layer 7a (7b), a nitride layer 8a (8b) and an oxide layer 9a (9b) which together formed an oxide-nitride-oxide (ONO) dielectric stack. Charges are stored in the nitride layer 8a (8b) that is separated from the silicon substrate 1e (1f) by a bottom oxide layer 7a (7b) and from a poly-silicon gate conductor 6a (6b) by a top oxide layer 9a (9b). As shown in FIG. 1c (2c), the NVM cell is fabricated on a layer of isolated polycrystalline storage islands (made of polycrystalline particles) 10a (10b) that is formed underneath a control poly-silicon gate electrode 6a (6b).

The single-poly NVM cell architecture shown in FIG. 1d (2d) applies poly-silicon on top of the silicon substrate or well inside silicon substrate 1c (2f) to form a single poly-silicon floating gate 11a (11b) and control gate 12a (12b) respectively, (folded control gate electrode 10c (10f)).

The structure of a split-gate NVM shown in FIG. 1e (2e) uses poly-silicon on a silicon substrate (well) 3d (3f) to form a polysilicon floating gate 13a (13b), a control gate 14a (14b) separated from the polysilicon floating gate 13a (13b) by control dielectric 15a (15b) and tunneling dielectric 16a (16b) between the floating gate 13a (13b) and the underlying substrate or well 3d (3f).

Data is stored in an EEPROM cell by modulating the threshold voltage, $V_{th}$, of the FET through the injection of charge carriers into the charge-storage layer from the channel of the FET. For example, with respect to an N channel FET, an accumulation of electrons in the floating gate, or in a dielectric layer above the FET channel region, causes the FET to exhibit a relatively high positive $V_{th}$. When the FET control gate is biased to the voltage required to read stored data, the FET, with a fixed drain voltage, will respond with different source-to-drain currents according to its $V_{th}$ level. The different source-to-drain current responses can be recognized and converted to the original bit information stored on the charge storage layer of the FET.

The number of bits stored in an EEPROM cell is determined by the number of different current responses, given by number-of-bits=$\log_2$ (number of current responses). The more different current responses that can be sensed and resolved, the more bits that can be stored in a single device cell. In modem sense amplifier (SA) design, the current can be measured with very high accuracy and speed. Usually reference cells are used to compare the current response and determines the bit-level information. However, the major challenge to achieving multi-bit storage in a single device cell is to accurately program or erase the charge-storage layer so as to achieve a designated threshold voltage level which results in a consistent device current response under the read operation.

In the conventional write and erase schemes, Drain-Avalanche-Hot Carrier Injection (DAHCI) and Fowler-Nordheim Tunneling (FNT) have been used for programming and erasing, respectively. The amount of charge injected into/out of the floating gate is controlled by the DAHCI/FNT currents generated by applying voltage pulses to the device gate and electrodes (source, drain, and substrate). Since there is no self-convergent mechanism for DAHCI programming and FNT erasing, the amount of charge in the floating gate which controls and determines the device threshold voltage shift is controlled by the durations of the voltage pulses applied to the gate and to the electrodes. Due to non-uniformity of distributed voltage supply across an integrated circuit memory and the RC time constant delay for a given voltage to reach individual devices in a memory array, the threshold voltage shifts associated with the devices in a memory array after conventional programming and erasing, are usually widely spread out. This hinders multiple-level recognition in a large number of cells in an array memory. To reduce such threshold voltage shift variations, an extra convergent circuit is usually supplied to fine-tune the desired threshold voltage level for each individual device cell in an EEPROM memory array. However, such an approach not only requires a complicated convergence circuit with more silicon area but also requires lengthy and time-consuming convergent procedures during programming.

In view of the aforementioned, the present invention provides an innovative scheme to achieve multiple-bit storage in electrically erasable programmable read-only memories (EEPROMs) to overcome the above drawbacks.

SUMMARY OF THE INVENTION

One object of the present invention is to enable multiple threshold voltage operation in a single EEPROM cell. Multiple threshold voltage operation leads to multiple-bits storage in a single cell.

Multiple-bits storage in a single cell can reduce the cost per bit for electrically erasable programmable read-only memories (EEPROMs). For instance, storage of two bits in a single cell can reduce by half the silicon memory cell area. In particular, since this invention applies device self-convergent Drain-Avalanche-Hot Hole Injection (DAHHI) for the NFET EEPROM and Drain-Avalanche-Hot Electron Injection (DA-HEI) for the PFET EEPROM, respectively, the complicated convergent circuits to overcome the over-erase issues in the conventional scheme are not required. It further reduces the large silicon area required for such complicated convergent circuits.

One aspect of the present invention is to provide self-convergent programming/erasing structures and methods for storing information capable of being represented by an n-bit binary word, where n is a selected integer, in a single nonvolatile memory cell, comprising: a NFET based nonvolatile memory cell having a source electrode capable of being coupled to a low voltage; and a switching circuit capable of being coupled to a drain of the NFET based nonvolatile memory cell for presenting information representable by an n-bit binary word to be stored in the NFET based nonvolatile memory cell.

The switching circuit includes a plurality of resistors connected in parallel, wherein the plurality of resistors have a common node for connection to a high voltage source. The resistances of the resistors are different from each other. The invention further comprises a control gate voltage switch having one end connected to a control gate and another end capable of being switched between a high voltage and an erase voltage. The nonvolatile memory comprises NFET based electrically erasable programmable read-only memory (EEPROM).

A further aspect of the invention is to provide self-convergent programming/erasing structure for multiple-bit storage in a single nonvolatile memory cell, comprising: an NFET based nonvolatile memory cell having a resistor capable of being coupled between a drain and a high voltage source; and a multiple level voltage-provider coupled to a control gate of the nonvolatile memory cell for presenting a selected voltage representing n bits of information to be stored in the NFET based nonvolatile memory cell. The amplitudes of voltages provided by the multiple level voltage-provider differ from each other. The nonvolatile memory comprises an NFET based electrically erasable programmable read-only memory (EEPROM).

One embodiment of the present invention provides storage of information corresponding to any value of an n-bit binary word, where n is a selected integer, in a single nonvolatile memory cell. In this embodiment, a PFET based nonvolatile memory cell has a source electrode capable of being coupled to a high voltage source; and a switching circuit coupled to a drain of the PFET based nonvolatile memory cell for presenting a voltage representing the n-bit word to be stored in the PFET based nonvolatile memory cell.

The switching circuit includes a plurality of resistors connected in parallel, wherein the plurality of resistors have a common node capable of being connected to a low voltage source. The resistances of said resistors are all different. The present invention further comprises a control gate voltage switch having one end connected to a control gate and another end capable of being switched between a low voltage source and an erase voltage source. The nonvolatile memory comprises PFET based Electrically Erasable Programmable Read-Only Memories (EEPROM).

A further purpose of the present invention is to provide structures and methods for storing information capable of being represented by a multiple bit binary word in a single nonvolatile memory cell, comprising: a PFET based nonvolatile memory cell having a resistor capable of being coupled between a drain and a source of a low voltage; and a source of multiple voltages capable of being coupled to a control gate of the nonvolatile memory cell for representing and presenting the information to be stored in the PFET based nonvolatile memory cell. The nonvolatile memory comprises PFET based electrically erasable programmable read-only memory (EEPROM). The voltage amplitudes provided by the source of multiple voltages are different.

The present invention also provides a method for storing information representable by a multiple bit binary word in a single nonvolatile memory cell, comprising: programming a NFET nonvolatile memory to a highest threshold voltage by applying a high voltage both to a control gate and a drain electrode of the nonvolatile memory; and erasing down from the highest threshold voltage to a specific threshold voltage by applying a gate voltage to the control gate and switching the drain electrode to a port of a switching circuit for presenting to the nonvolatile memory a signal representing the information to be stored in the nonvolatile memory cell. The information to be stored is representable by an n-bit binary word, where n is an integer.

One aspect of the present invention is to provide a method for storing information representable by a multiple bit binary word in a single nonvolatile memory cell, comprising: programming a NFET nonvolatile memory to a highest threshold voltage by applying a high voltage to a control gate and a drain electrode of the NFET based nonvolatile memory; and erasing down from the highest threshold voltage to a specific threshold voltage by applying a specific gate voltage to the control gate with a selected resistor coupling between the drain electrode and the high voltage source.

A further aspect of the invention is to provide a method for storing information representable by a multiple bit binary word in a single nonvolatile memory cell, comprising: programming a PFET based nonvolatile memory to a most negative threshold voltage by applying a high voltage to both a source electrode and a substrate of the PFET nonvolatile memory; and erasing up from the most negative threshold voltage to a specific negative threshold voltage by applying a gate voltage to the control gate and switching the drain electrode to a port of a switching circuit for presenting to the drain a voltage representing the multiple bit binary word to be stored in the PFET nonvolatile memory cell.

Further, the present invention discloses a method for storing information representable by a multiple bit binary word in a single nonvolatile memory cell, comprising: programming a PFET nonvolatile memory to a most negative threshold voltage by applying a high voltage to both a source electrode and to a substrate of the PFET nonvolatile memory; and erasing up from the most negative threshold voltage to a specific negative threshold voltage by applying a specific gate voltage to the control gate with a resistor of a selected value coupling between the drain electrode and a low voltage source.

An embodiment of the invention also provides a method for reading information representable as a multiple bit binary word stored as an electric charge in a single nonvolatile memory cell, comprising: applying a read voltage to a control gate of the nonvolatile memory; and connecting a drain electrode of the nonvolatile memory to a high voltage source through a current load; wherein the driving current of the nonvolatile memory in response to different threshold voltage levels generates different output voltages.

The output voltage in response to the actual threshold voltage can be compared and converted to the original bit representation. To achieve this, the nonvolatile memory comprises an NFET based electrically erasable programmable read-only memory (EEPROM).

Another embodiment of the invention provides a method for reading information representable by a multiple bit binary word stored in a single nonvolatile memory cell, comprising: applying a read voltage to a control gate of the nonvolatile memory; and connecting a drain electrode of said nonvolatile memory to ground through a current sink; wherein the driving current of the nonvolatile memory passing through the current sink generates an output voltage representative of the actual threshold voltage which in turn reflects the value of the information stored in said cell.

The output voltage can be compared and converted to the original bit representation. The nonvolatile memory comprises a PFET based electrically erasable programmable read-only memory (EEPROM).

BRIEF DESCRIPTION OF THE DRAWINGS

For a better understanding of the present invention and to show how it may be carried into effect, reference will now be made to the following drawings, which show the preferred embodiments of the present invention, in which:

FIG. 8 shows an example of a correspondent logic symbol table assigned to each switching resistor port.

DETAILED DESCRIPTION OF THE EMBODIMENTS

The present invention includes methods and structures to store any one of N voltage values in a single EEPROM cell, where each of the N voltage values can be represented by an n-bit binary word, where n=$\log_2$N and N in an integer, such as 8, 16 or 32, representable by a power of 2. Thus if N is 16, n is 4 and a four bit binary code word is sufficient to represent any one of sixteen (16) possible voltage values which can be stored in the EEPROM cell. In the following description, numerous specific details are set forth in order to provide a thorough understanding of the present invention, and the scope of the present invention is expressly not limited except as specified in the accompanying claims. One skilled in the relevant art will recognize, however, that the invention may be practiced without one or more of the specific details. In order to avoid obscuring aspects of the invention, well known structures, materials, or operations are often not shown or described.

Those of ordinary skill in the art will immediately realize that the embodiments of the present invention described herein (both methods and schematics) are illustrative only and are not intended to be in any way limiting. Other embodiments of the present invention will readily suggest themselves to persons skilled in the art in view of this disclosure.

This invention relates to structures and methods to enable multiple threshold voltage operation in a single EEPROM cell.

Multiple threshold voltage level operation makes possible the storage in a single cell of information representable by any one combination of n bits. Hereinafter, storage of such information in a single cell will sometimes be called "multiple-bit storage". Multiple-bit storage in a single cell can reduce the cost per bit for Electrically Erasable Programmable Read-Only Memories (EEPROM). For instance, two bits in a single cell can cut in half the silicon memory cell area. In particular, since this invention applies device self-convergent Drain-Avalanche-Hot Hole Injection (DAHHI) for an NFET based EEPROM and Drain-Avalanche-Hot Electron Injection (DAHEI) for a PFET based EEPROM, respectively, the complicated convergent circuits to overcome the over-erase or over-programming issues in conventional prior art structures are not required. This invention further reduces the large silicon area required for such complicated convergent circuits.

Figure 1A:
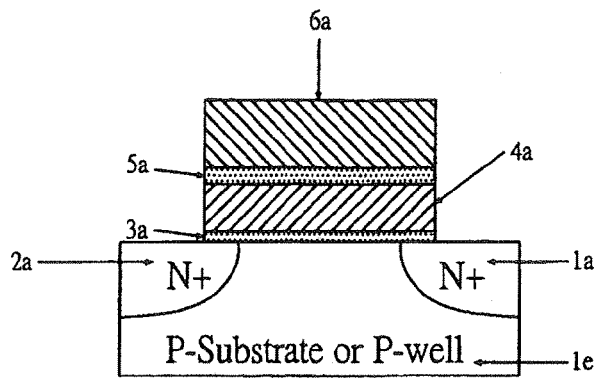
FIGS. 1a~1e show typical cross-sectional views of NFET based EEPROM cells with different architectures.
Figure 1B:
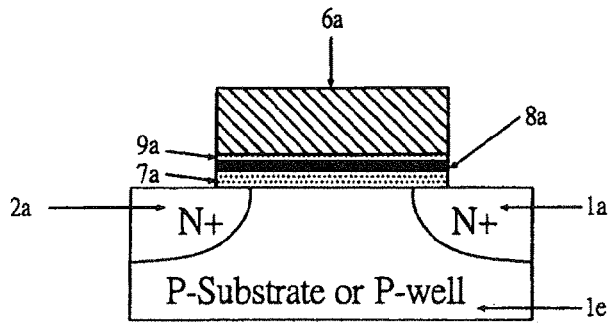
Figure 1C:
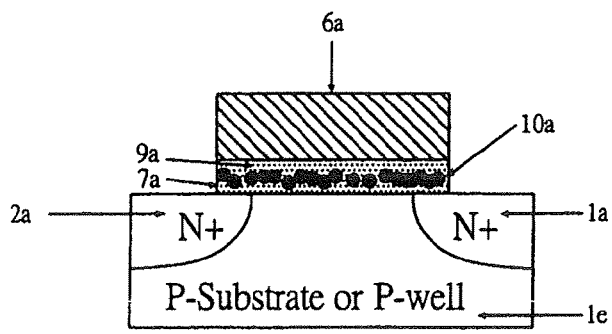
Figure 1D:
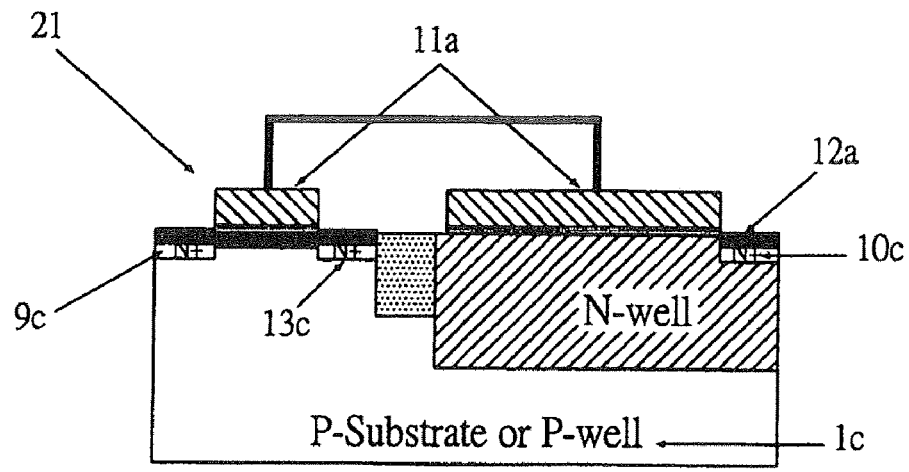
Figure 1E:
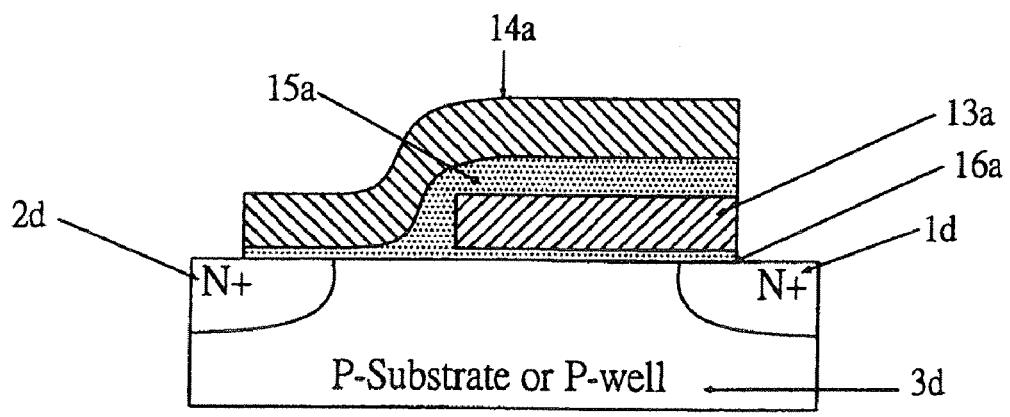
Figure 2A:
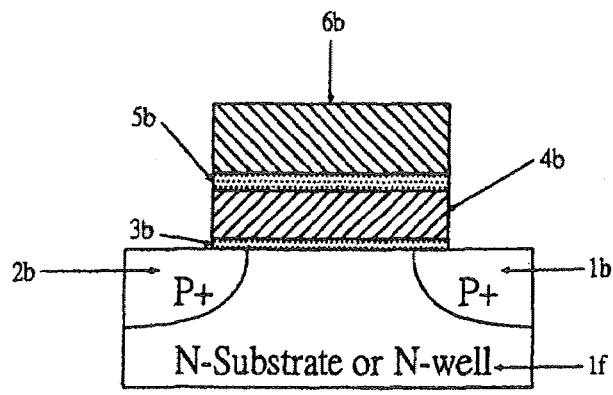
FIGS. 2a~2e show typical cross-sectional views of PFET based EEPROM cells with different architectures.
Figure 2B:
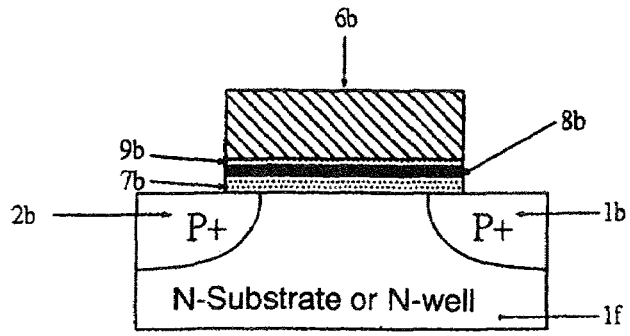
Figure 2C:
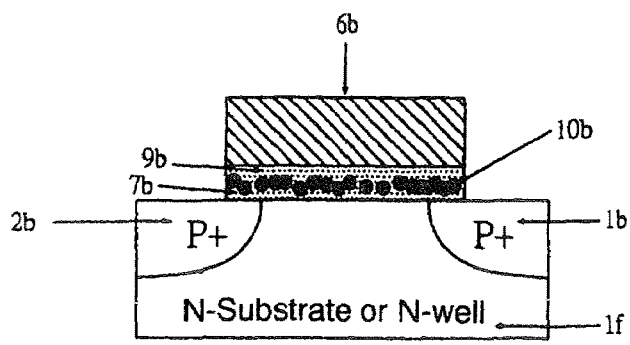
Figure 2D:
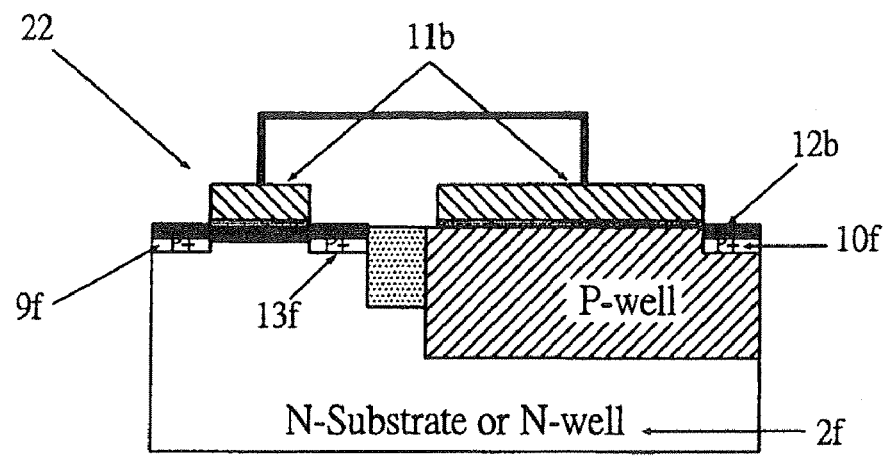
Figure 2E:
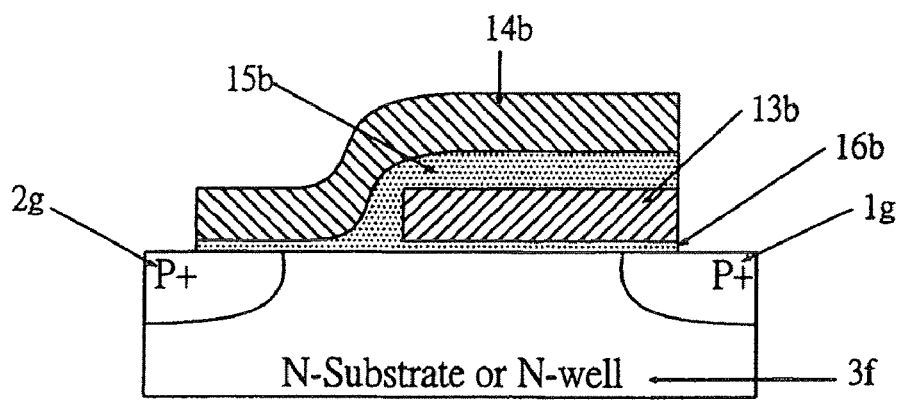
Figure 3A:
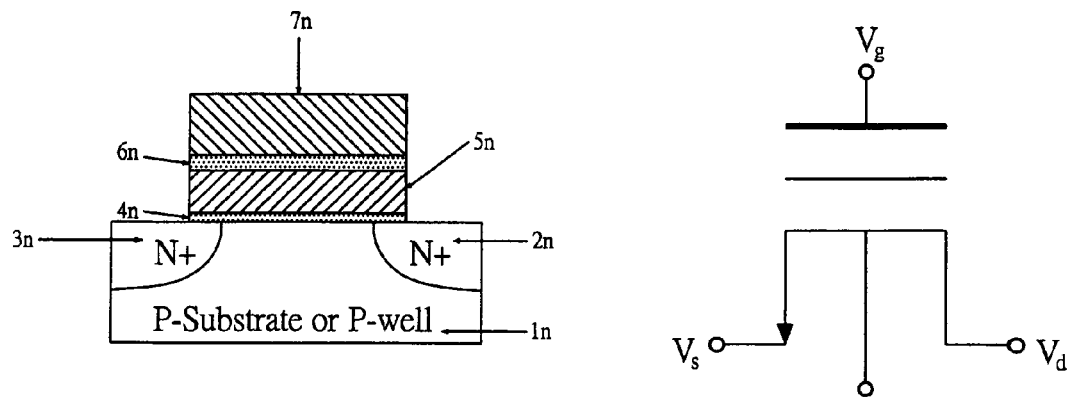
FIGS. 3a and 3b show N channel and P channel EEPROMs, respectively, and equivalent circuits for an NFET and a PFET.
Figure 3B:
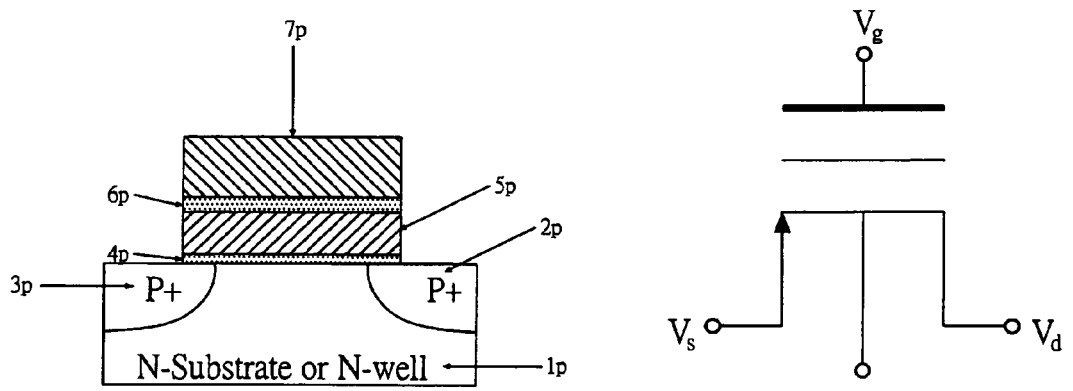
Figure 4A:
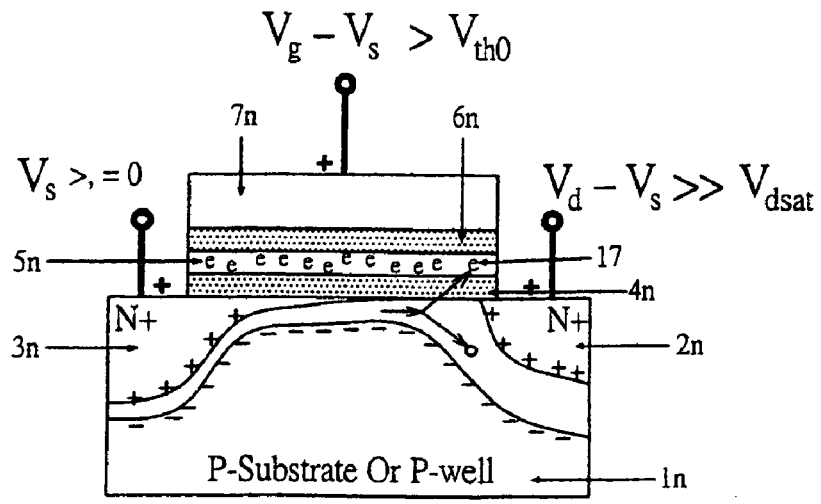
FIGS. 4a and 4b show cross-sectional views of the electrical structure and related process for initial programming and writing to erase-down for a NFET based EEPROM.
Figure 4B:
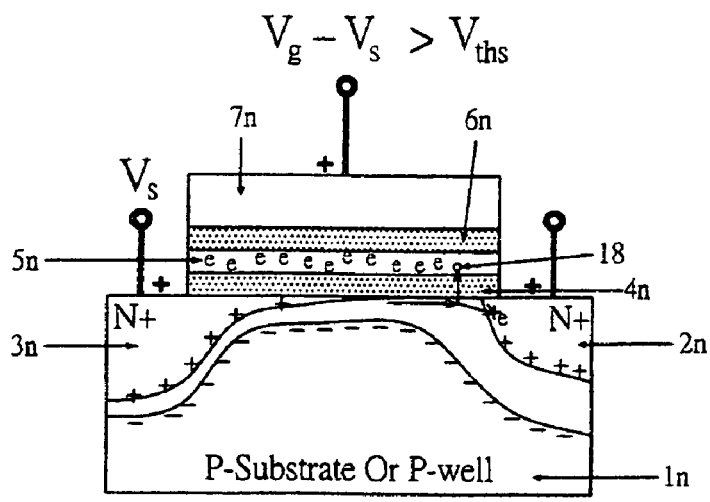
Figure 12:
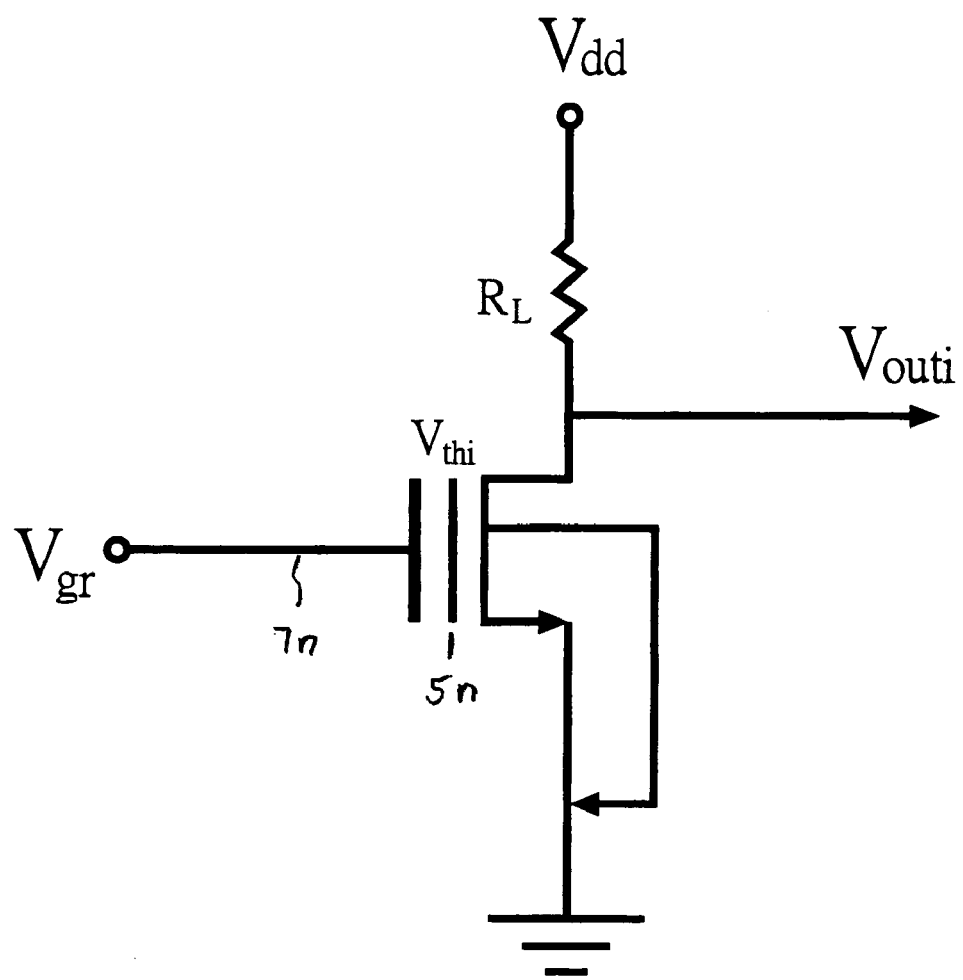
FIG. 12 shows a simple "READ" schematic for an NFET based EEPROM.

This invention applies innovative program/erase methods and structures to achieve precise EEPROM threshold voltages for multiple-bit storage in a single cell. FIGS. 3a and 3b shows EEPROMs and equivalent circuits for NFET and PFET memory cells, respectively. The NVM cell architecture of FIGS. 3a and 3b comprises P-substrate or P-well 1n and N-substrate or N-well 1p, respectively. Drain/source regions 2n, 3n (FIG. 3a) or 2p, 3p (FIG. 3b), floating gates (FIG. 3a) or 5p (FIG. 3b) store charge representing different levels of information and are separated from the silicon substrate by a bottom oxide layer 4n (FIG. 3a) or 4p (FIG. 3b) and from a poly-silicon gate conductor 7n (FIG. 3a) or 7p (FIG. 3b) by a top oxide layer 6n (FIG. 3a) or 6p (FIG. 3b). Under the conditions of $V_g-V_s>V_{th0}$, where $V_g$ is the gate voltage, $V_s$ is the source voltage and $V_{th0}$ is the device original threshold voltage, and $V_d-V_s>>V_{dsat}$, where $V_d$ is the drain voltage and $V_{dsat}$ is the saturation voltage, NFET based EEPROM cells are initially programmed to the maximum threshold voltage $V_{thmax}$ by Drain-Avalanche-Hot Electron Injection (DAHEI) (FIG. 4a). The maximum number of electrons is stored in the floating gate 5n in this state. Then, a Drain-Avalanche-Hot Hole Injection (DAHHI) method is applied to erase-down to a specific threshold voltage (FIG. 4b). The device is "on and saturated" under the conditions, $V_g-V_s>V_{ths}$. In this situation, the saturation threshold voltage is lower than the linear threshold voltage $V_{thmax}$ due to Drain Induced Barrier Lowering (DIBL) with $V_d-V_s>>V_{dsat}$. The Drain-Avalanche-Hot Holes (DAHH) are injected into floating gate 5n and the hot holes gain energies from the horizontal potential difference $V_d-V_{dsat}$ and the vertical potential difference $V_d-V_f$, where $V_f$ is the floating gate potential. $V_f$ is a function of the charges stored in the floating gate and the applied control gate voltage $V_g$. The effect of electrons stored in or on floating gate 5n is initially reduced by the hot hole injection causing $V_{th}$ to drop and the drain current to increase. The drain current reaches a maximum steady current, when the horizontal potential $V_d-V_{dsat}$, and the vertical potential difference $V_d-V_f$ cannot provide enough energy for holes to flow over the floating gate 5n. When steady state is reached, the number of electrons in the floating gate remains constant and the device threshold voltage has self-converged to a lower threshold voltage which is a function of the applied control-gate voltage and the maximum drain current. For "READ" operation, a read voltage $V_{gr}$ is applied on the control gate 7n and the drain electrode 2n is connected through a load resistor $K_L$ to $V_{dd}$, as shown in FIG. 12. Due to the distinctive device threshold voltage obtained from the erase-down process, the output voltage from the drain electrode 2n can be distinctively recognized and converted back to the original bit information.

Figure 5A:
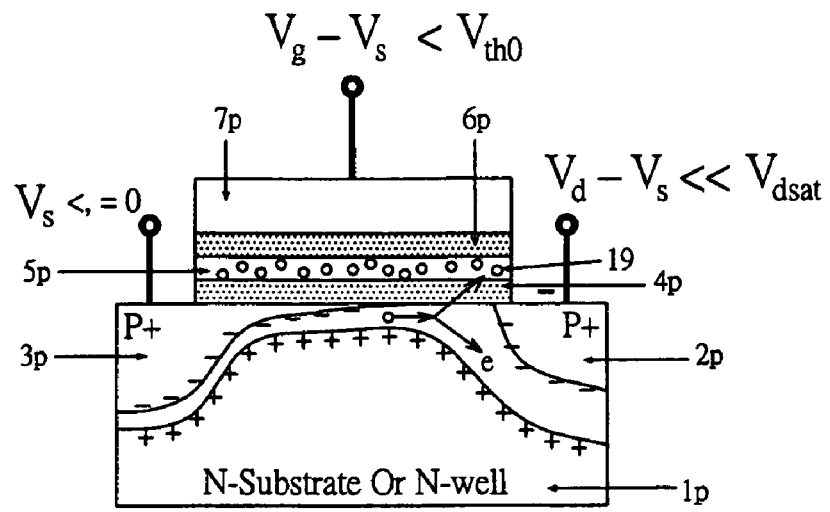
FIGS. 5a and 5b show cross-sectional views of the electrical process for initial programming and writing to erase-up for a PFET based EEPROM.
Figure 5B:
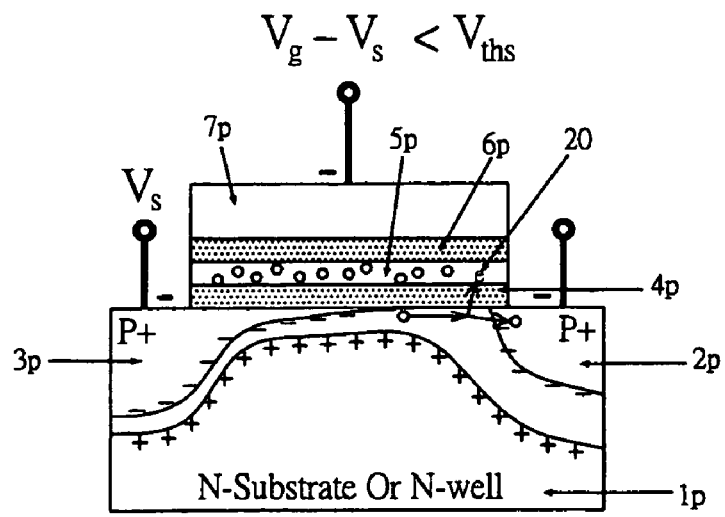
Figure 17:
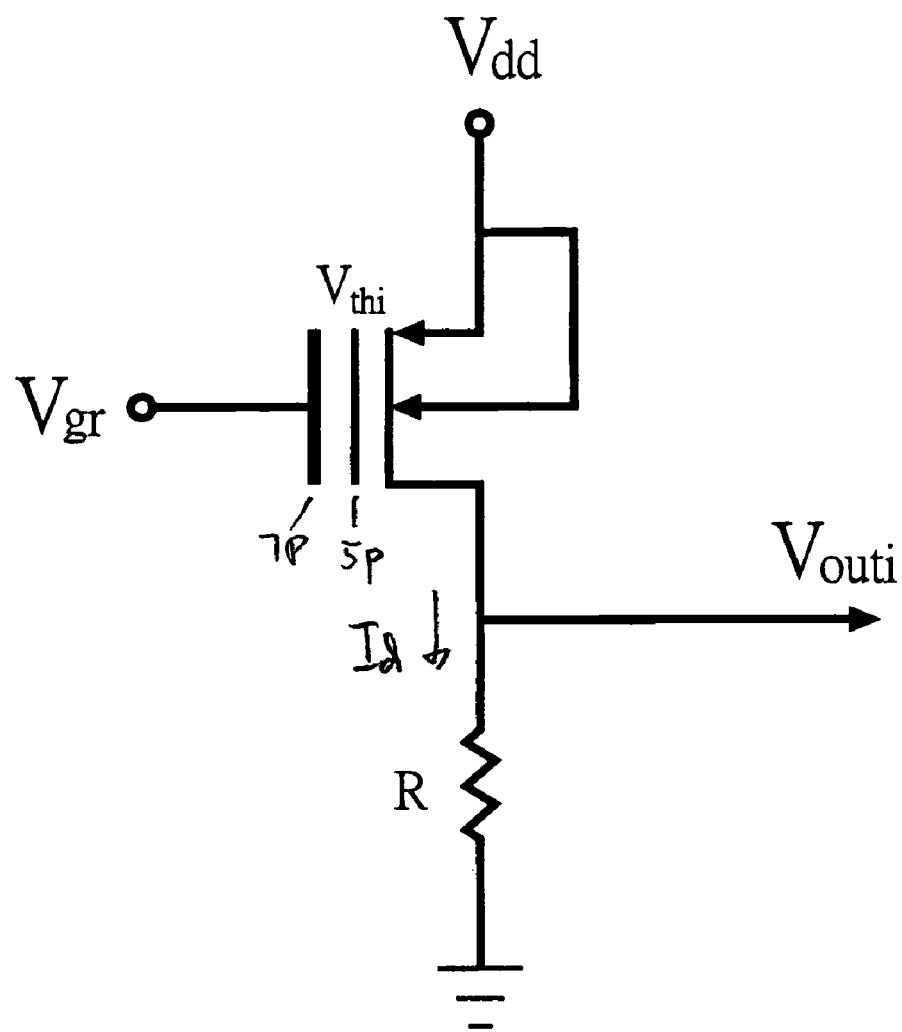
FIG. 17 shows a simple "READ" schematic for a PFET based EEPROM.

Similarly, under the conditions of $V_g-V_s<V_{th0}$, where $V_{th0}$ is the device original threshold voltage, and $V_d-V_s<<V_{dsat}$, where $V_{dsat}$ is the saturation voltage, PFET based EEPROM cells are initially programmed to the most negative threshold voltage $V_{thmax}$ by Drain-Avalanche-Hot Hole Injection (DAHHI) (FIG. 5a). A maximum number of holes is stored in floating gate 5p. Then a Drain-Avalanche-Hot Electron Injection (DAHEI) method is applied to erase-up the threshold voltage to a specific negative threshold voltage for a cell (FIG. 5b). The device is "on and saturated" under the conditions, $V_g-V_s<V_{th0}$ where $V_{th0}$ is less negative than the linear threshold $V_{thmax}$ due to Drain Induced Barrier Lowering (DIBL) with saturation, $V_d-V_s<<V_{sat}$ (all negative for PFET). The Drain-Avalanche-Hot Electrons (DAHE) are injected into floating gate 5p and the hot electrons gain energies from the horizontal potential difference $V_d-V_{dsat}$ and the vertical potential difference $V_d-V_f$ where $V_f$ is the voltage on the floating gate. The charge on floating gate 5p resulting from holes stored in floating gate 5p is initially reduced due to the hot electron injection. This raises $V_{th}$ and increases the drain current. Drain current reaches a maximum steady current when the threshold voltage stops being raised which is when the horizontal potential difference $V_d-V_{dsat}$ and the vertical potential difference $V_d-V_f$ can not provide enough energy for electrons to flow over oxide 4p into the floating gate 5p. When steady state is reached, the number of holes in the floating gate 5p remains constant and the device threshold voltage self-converges to a higher negative threshold voltage. For "READ" operation, the device is applied with a read voltage $V_{read}$ on control gate 7p and the drain electrode 2p is connected through a sink resistor R to $V_{ss}$ as shown in FIG. 17. Due to the distinctive threshold voltage obtained from the erase-up process, the output voltage $V_{out}$ from the drain electrode 2p can be distinctively recognized and converted back to the original bit information.

Figure 6:
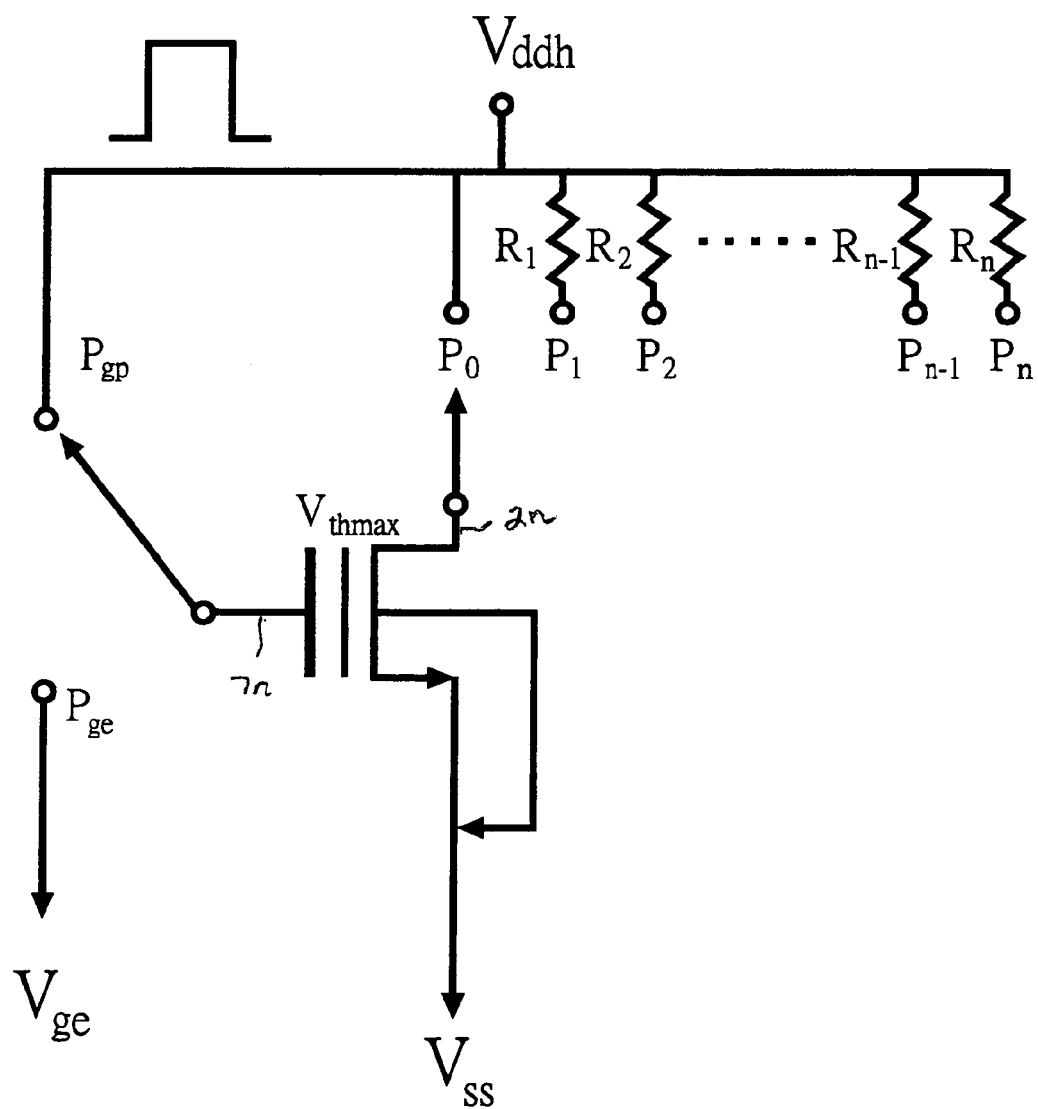
FIG. 6 shows one of the embodiments for an NFET based EEPROM and illustrates initial programming to the targeted maximum threshold voltage.
Figure 7:
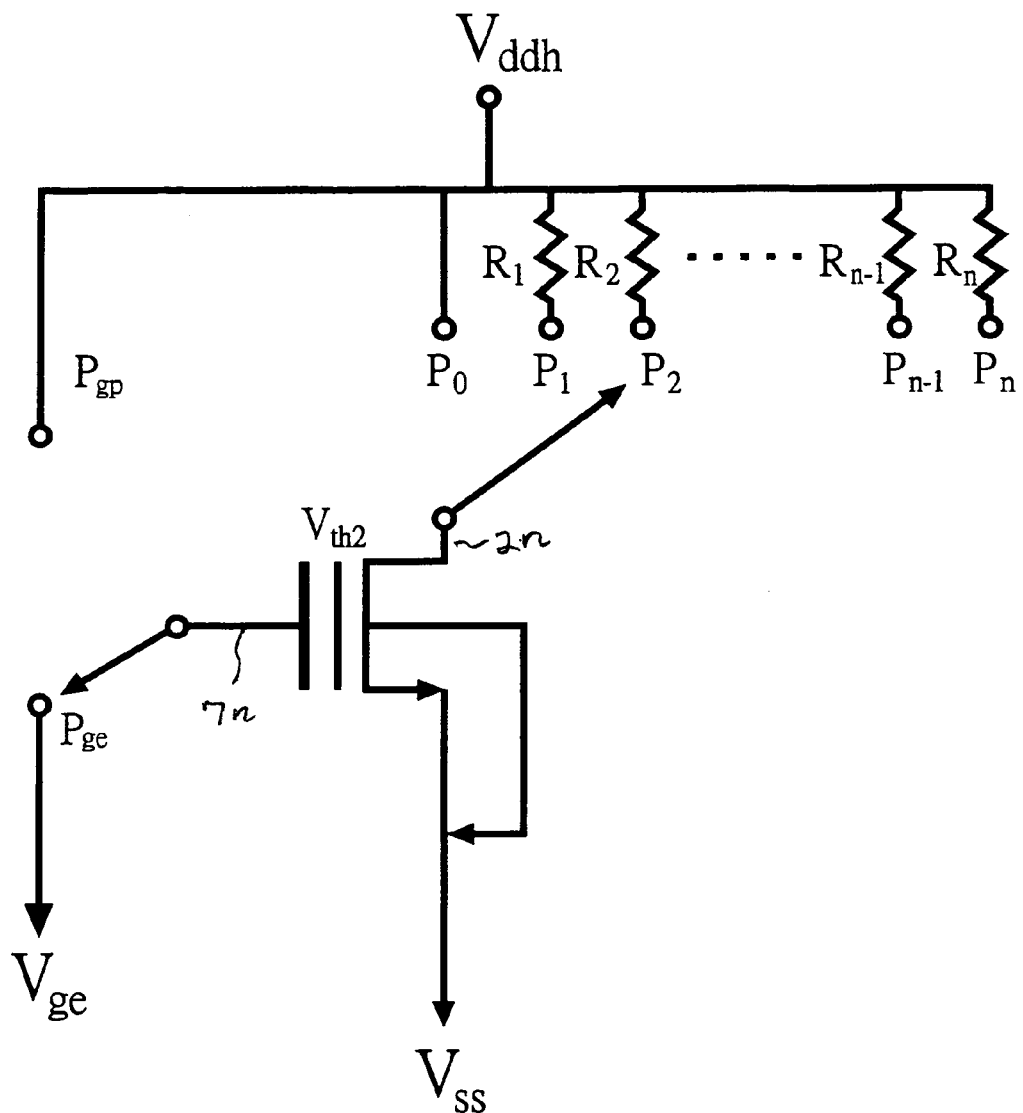
FIG. 7 illustrates the erase process to shift-down from the maximum threshold voltage $V_{thmax}$ to a specific threshold voltage $V_{th2}$.

The schematic shown in FIG. 6 comprises a NFET EEPROM cell and a tank of resistors, $R_1, R_2, \ldots R_{n-1}, R_n$. The particular resistor in the plurality of resistors to be selected by a switching circuit has a resistance which represents the value of the information (which can equivalently be considered to be a specific combination of binary bits in an n-bit binary word) stored on floating gate 5n (FIG. 4a). Thus each resistor represents one set of "multi-bits", that is one specific combination of bits in an n-bit binary word. Preferably, the resistors are connected in parallel and have a common node that is coupled to a positive voltage such as $V_{dd}$ (not shown). For the initial programming, a voltage pulse with high voltage amplitude $V_{ddh}$, much greater than device saturation voltage $V_{sat}$ is applied to the control gate (such as gate 7n in FIG. 4a) and the drain electrode (such as drain 2n in FIG. 4a) for some period of time until the device reaches the desired maximum threshold voltage $V_{thmax}$. In one embodiment, the drain 2n is coupled to port $P_0$ without a resistor. Drain-Avalanche-Hot-Electron Injection (DAHEI) is then used to create the maximum threshold voltage for the device as shown in FIG. 4. The initial state of the NFET EEPROM device can be considered as all "zero" or all "one" state. The whole NFET EEPROM array can be set to this initial state. To program other than the initial state, NFET EEPROM is erased down from $V_{thmax}$ to $V_{th2}$ by applying gate voltage $V_{ge}$ to control gate 7n and switching drain electrode to port $P_2$ connected through resistor $R_2$ to $V_{ddh}$, where $R_2$ represents a selected number and combination or set of multi-bits as shown in FIG. 7. The voltage $V_{ge}$ applied to the control gate 7n shall be enough to turn on the NFET EEPROM during the process. Since the steady-state threshold voltage in the write-down process is self-converged and independent of the initial maximum threshold voltage, there is no need to converge to an initial narrow distribution of the maximum threshold voltage for EEPROM arrays as long as the initial threshold voltage for each cell in the array is above the second highest threshold voltage.

The resistor switch shown in FIGS. 6 and 7 is connected by a logic circuit to represent a given state of multi-bits to be stored. Every port represents a unique combination or set of multi-bits. For example, FIG. 8 shows the switch assignment table created using ports $P_0$ to $P_n$ (FIGS. 6 and 7) wherein each port corresponds to a particular value (i.e. combination) of the n bits $B_1 \sim B_{log2\ (n+1)}$ stored on the floating gate 7n.

In accordance with this invention, EEPROM devices are initially programmed to the highest state, namely, the highest threshold voltage of the EEPROM devices. The multiple threshold voltages levels possible to be associated with each EEPROM device are divided between the lowest threshold voltage and the highest threshold voltage. Each threshold voltage level corresponds to a unique set of multi-bits. The bits stored in the EEPROM device are given by $\log_2$ (number of multiple threshold voltage levels). For example, sixteen threshold voltage levels require four (4) bits. Due to Drain-Induced-Barrier-Lowering (DIBL) from the high voltage $V_{ddh}$, a moderate control gate voltage, Vge, is sufficient to turn on the NFET EEPROM device, while this moderate control gate voltage is not enough to cause significant tunneling from the floating gate to the control gate which, if it occurred would change the threshold voltage.

The Drain-Avalanche-Hot Carriers (DAHC) are generated in the depleted region near the drain electrode. Since a highly positive voltage much greater than the saturation voltage is supplied to the drain electrode of an NFET, channel electrons are injected and accelerated in the drain depletion region. Electrons in the drain depletion region lose their energies from the impact ionization process. With positive drain potential, electrons flow toward the drain electrode, while most holes move toward the substrate. However, some hot holes gaining greater energies than the oxide energy barrier (3.7 ev) are able to reach and annihilate electrons in the floating gate, shown in FIG. 4. The process will reach a steady state when the device current increase due to the down-shifting of the threshold voltage resulting from losing electrons in the floating gate balances the drain potential drop from the increase of the current flowing through the load resistor connected between the drain and the source of the supply voltage. The dropped drain voltage is not able to support enough energy for hot holes to flow over the oxide into the floating gate. Meanwhile, electron tunneling from the substrate to the floating gate is not significant due to insufficient electrical field generated between drain and floating gate, and between floating gate and control gate. Thus the number of electrons in the floating gate remains constant in the steady state.

Figure 9:
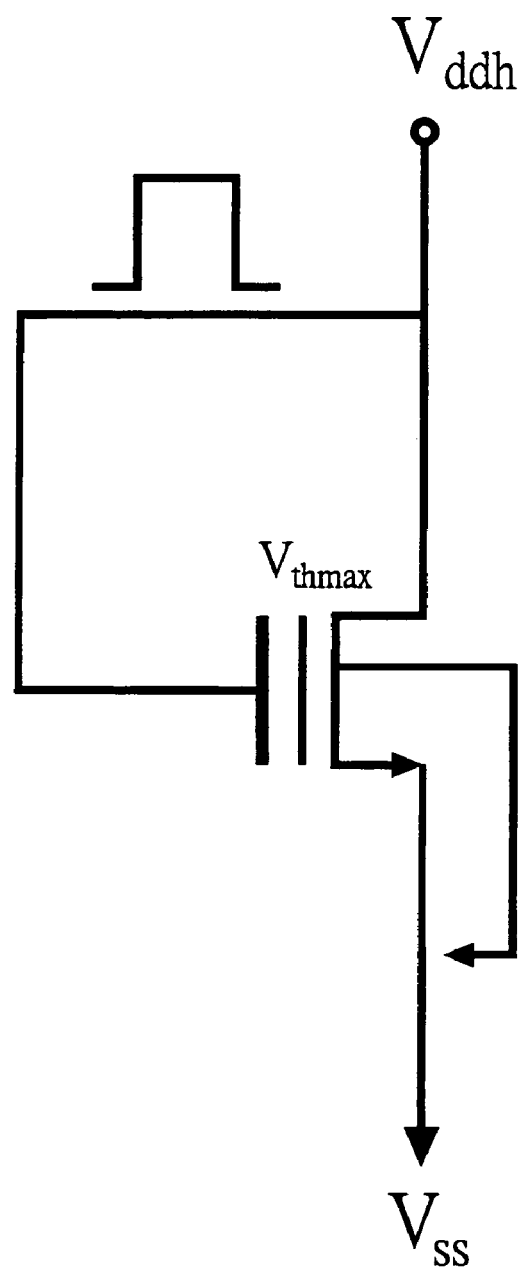
FIG. 9 shows the schematic of another embodiment of an NFET based EEPROM and illustrates its initial programming to the maximum threshold voltage.
Figure 10:
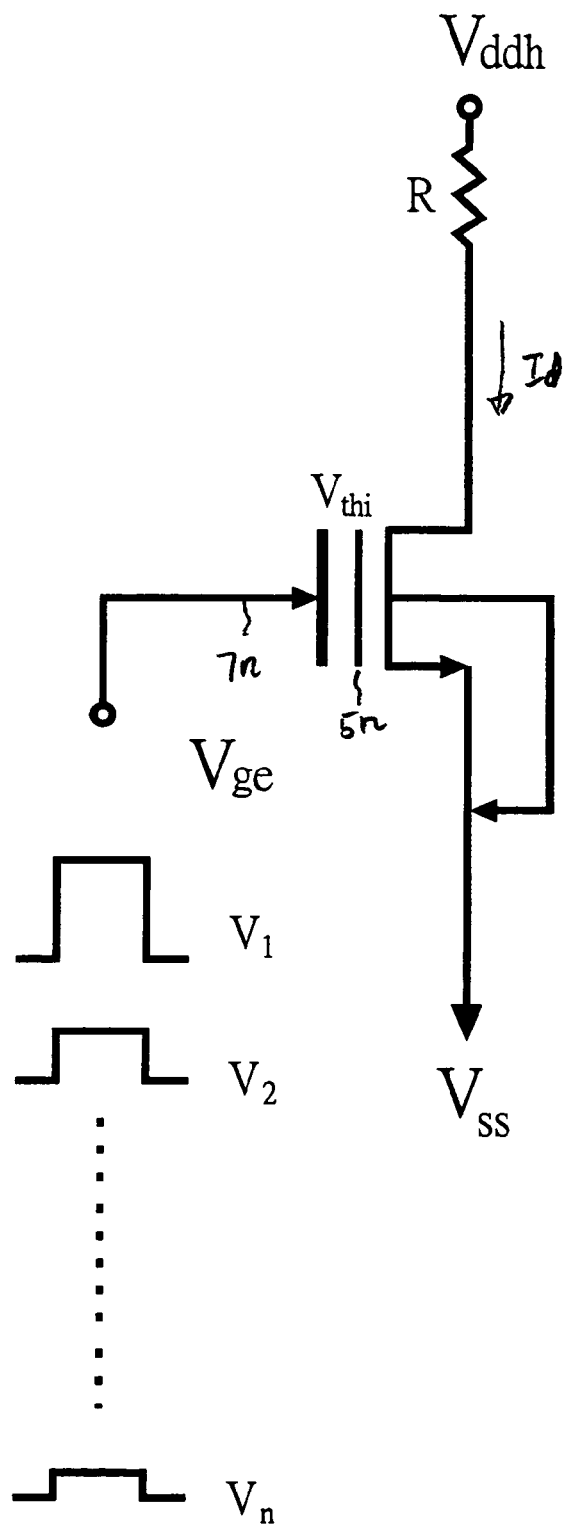
FIG. 10 illustrates the erase-down process by applying different voltage amplitudes on the control gate of an NFET based EEPROM.
Figure 11:
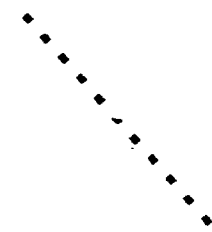
FIG. 11 shows an example of a logic symbol table showing for different voltage amplitudes.

FIGS. 9, 10, and 11 show another embodiment of an NFET based EEPROM. In this embodiment, the programming process to the highest threshold voltage is the same as the previous one. In the erase-down process, instead of connecting to a bank of multiple resistors (as shown in FIGS. 6 and 7), the NFET EEPROM device is connected to a fixed resistor R (FIG. 10). Gate voltages with different amplitudes (as shown by pulses $V_1$ to $V_n$) are applied to the control gate $7n$. NFET EEPROM is erased down to $V_{thi}$ by applying voltage $V_{gei}$ to the control gate, while the drain electrode is connected through the constant resistor R to the high voltage $V_{ddh}$. The applied gate voltage amplitude represents a unique value (i.e. combination) of multi-bits. Thus, in one example, a circuit (called a "multi-voltage provider") is employed to apply multiple voltage-amplitudes to the control gate $7n$ to represent each value of the multi-bits. The amplitudes of the gate voltage represent the values of the multi-bits stored on the floating gate $7n$. FIG. 11 shows a table representing gate voltages ("none" to $V_n$) corresponding to the electrical charge represented by multi-bits $B_1$ to $B_{\log2 (n+1)}$ stored on floating gate $7n$.

To enable the erase-down process, the voltage amplitudes applied to control gate $7n$ are all large enough to turn on the NFET device. The horizontal potential difference between the pinch-off point of the NFET device and the drain voltage is $V_d-V_{sat}$ and the vertical potential difference is $V_d-V_f$ (see FIGS. 4a and 4b). The hot holes injected into floating gate $5n$ in the depleted region gain their energy by the absolute value of $e(V_d-V_{sat})$ and by the absolute value of $e(V_d-V_f)$ where e is the electron charge. When $V_d$ falls below some value such that hot holes in the depletion region do not have enough energy to flow over the oxide barrier onto the floating gate $5n$, the number of electrons in the floating gate $5n$ remains constant leading to a smaller specific threshold voltage for the NFET EEPROM device. The drain voltage $V_d$ of the NFET in FIG. 10 is given by $V_{ddh}-I_dR$. For a given $V_{ge}$ and a given R, $I_d$ reaches a steady maximum current when the increase of resistor current resulting in the dropped drain voltage balances the increase of device current from threshold voltage lowering.

A simple schematic for the "READ" operation is shown in FIG. 12. The programmed NFET EEPROM device is read by applying a read voltage $V_{gr}$ to the control gate $7n$ with drain connected through load resistor $R_L$ to $V_{dd}$. The device driving current in response to different threshold voltage levels $V_{thi}$ generates an output voltage $V_{outi}$. The distinctive $V_{outi}$ can be compared to a series of multi-bit numbers in a table and the closest value selected to convert this output voltage $V_{outi}$ to the original bit representation $B_i$.

Figure 13:
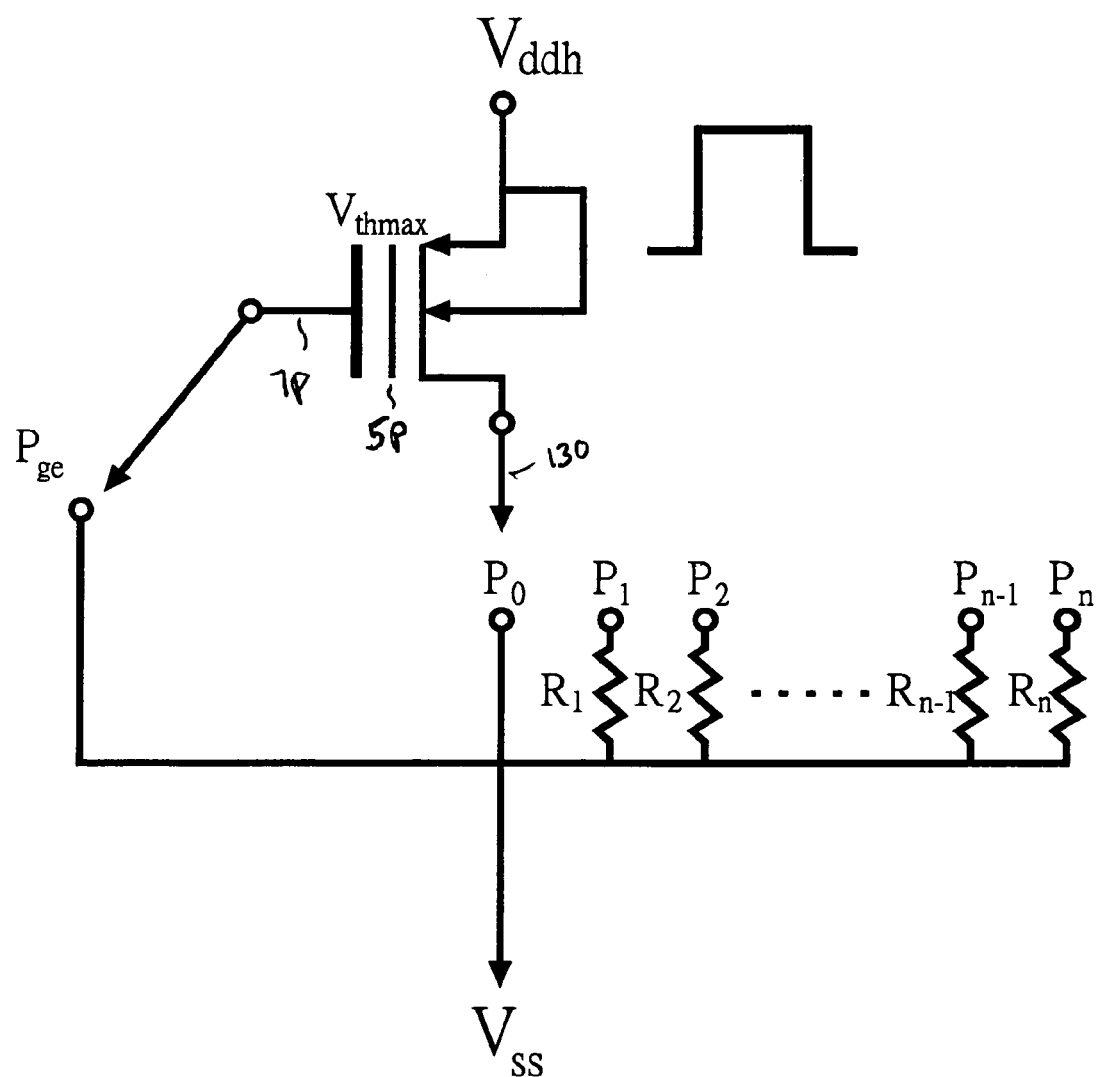
FIG. 13 shows an embodiment of a PFET based EEPROM and illustrates a pulse waveform representing initial programming to the most negative threshold voltage.

The schematic shown in FIG. 13 comprises a PFET EEPROM cell (such as shown in FIGS. 5a and 5b) and a bank of parallel-connected resistors $R_1, R_2 \ldots, R_{n-1}, R_n$. One of the plurality of resistors $R_1 \ldots R_n$, selected by a switch 130, represents the value of the multi-bits stored on floating gate $5p$. Each resistor represents one value of multi-bits. Preferably, the resistors are connected in parallel and have a common node coupled to a low voltage $V_{ss}$ which in one embodiment corresponds to system ground. PFET EEPROM in one embodiment is initially programmed to the most negative threshold voltage $V_{thmax}$ by applying high voltage $V_{ddh}$ to source electrode and substrate, while the control gate and drain electrode are tied to $V_{ss}$. This programming utilizes Drain-Avalanche-Hot-hole Injection (DAHHI) as shown in FIG. 5. The initial state of each PFET EEPROM device can be considered as all "zero" or all "one". If desired, the whole PFET EEPROM array can be set to this initial state. The steady-state most negative threshold voltage in the write-up process is self-convergent and independent of the initial threshold voltage. Therefore, the initial narrow distribution of most negative threshold voltages for a PFET EEPROM array does not have to be converged as long as the initial threshold voltage for each cell devices in the array is more negative than the second lowest negative threshold voltage.

Figure 14:
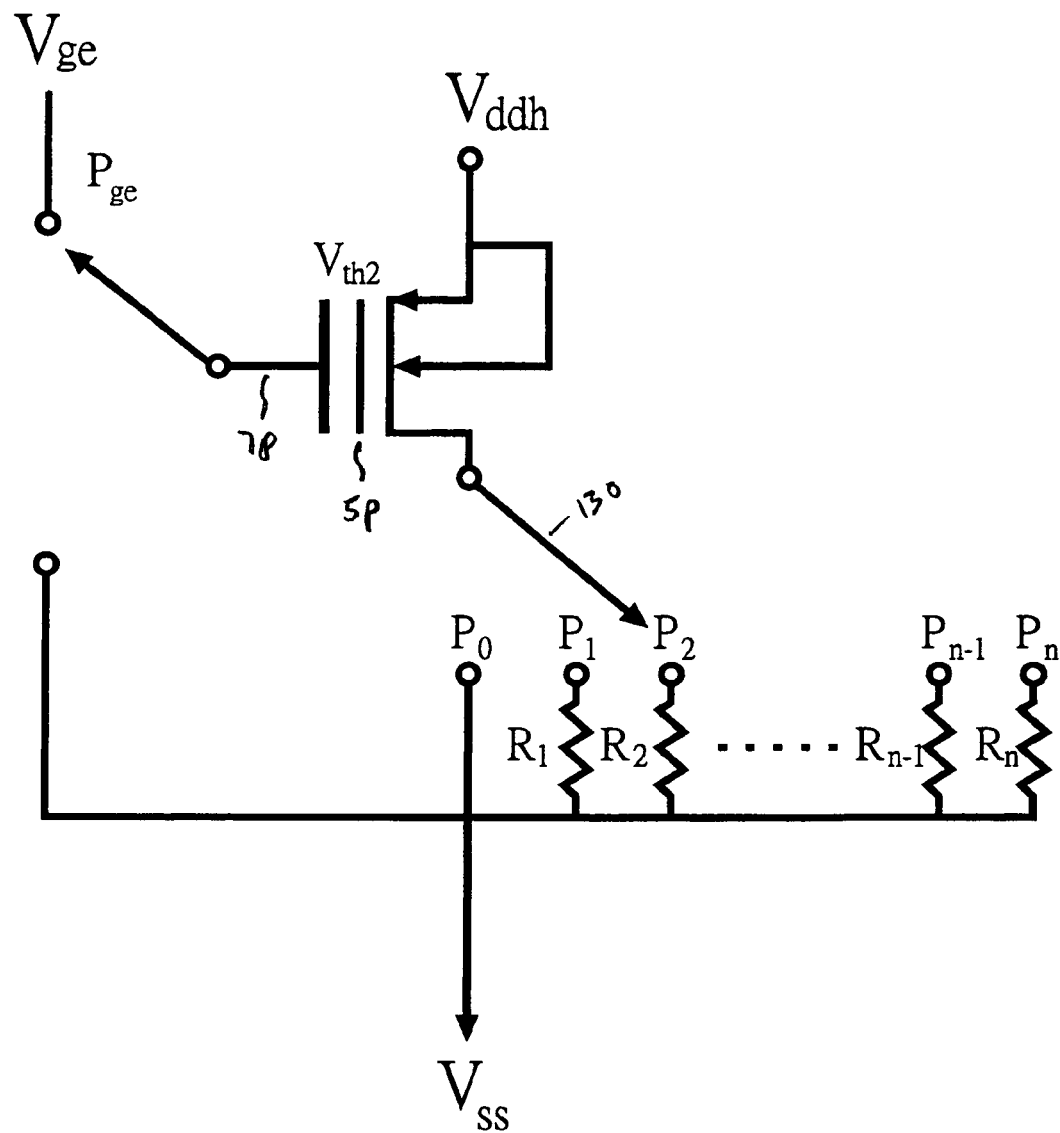
FIG. 14 illustrates the erase process to shift-up from the most negative threshold voltage $V_{thmax}$ to a specific negative threshold voltage $V_{th2}$ for the embodiment of FIG. 13.

To illustrate the write-up process, the drain electrode of the PFET cell is brought by switch 130 into contact with resistor $R_2$ connected to low voltage $V_{ss}$, as shown in FIG. 14. The switch 130 is connected by a logic circuit to a given resistor which represents a value of multi-bits to be stored. For example, the drain electrode is connected by switch 130 to node $P_2$ which is connected through resistor $R_2$ to $V_{ss}$. A voltage $V_{ge}$ applied to the control gate $7p$ shall be low enough to turn on the PFET EEPROM device during the process. PFET EEPROM is erased up from $V_{thmax}$ to $V_{th2}$ by applying gate voltage $V_{ge}$ to control gate $7p$ and switching drain electrode to port $P_2$ connected through resistor $R_2$ to $V_{ss}$, where $R_2$ can represent a value of multi-bits. For example, FIG. 8 shows a table showing the multi-bit values stored on floating gate $5p$ (FIGS. 14, 5a and 5b) which correspond to node $P_0$ to $P_n$ (corresponding to resistors none, $R_1, R_2 \ldots R_n$ respectively). Due to Drain-Induced-Barrier-Lowering (DIBL) from the high voltage $V_{ddh}$, a moderate low control gate voltage is sufficient to turn on the PFET EEPROM device shown in FIG. 14, while the voltage is not enough to cause significant electron tunneling from the floating gate $5p$ to the control gate $7p$ and from the substrate to the floating gate $5p$.

The Drain-Avalanche-Hot Carriers (DAHC) are generated in the depleted region near the drain electrode. Since the drain electrode is supplied with a highly negative voltage more negative than the saturation voltage relative to the source, channel holes are injected and accelerated in the drain depletion region. Holes in the drain depletion region lose their energies from the impact ionization process. With the negative drain potential, holes flow toward the drain electrode, while most electrons move toward the substrate. However, some hot electrons gaining greater energy than the oxide energy barrier (3.1 ev) are able to reach and annihilate holes in the floating gate $5p$, shown in FIGS. $5a$ and $5b$. The process will reach a steady state when the device current increase due to the up-shifting of the threshold voltage resulting from losing holes in the floating gate balances the drain potential rise from the increase of the current flowing through the resistor. The raised drain voltage is not able to support enough energy for hot electrons to flow over the oxide $4p$ (FIGS. $5a$ and $5b$) to floating gate $5p$. Meanwhile, tunneling in this process is not significant due to insufficient electrical field generated between drain and floating gate $5p$, and between floating gate $5p$ and control gate $7p$. Thus the number of holes in the floating gate remains constant in the steady state.

Figure 15:
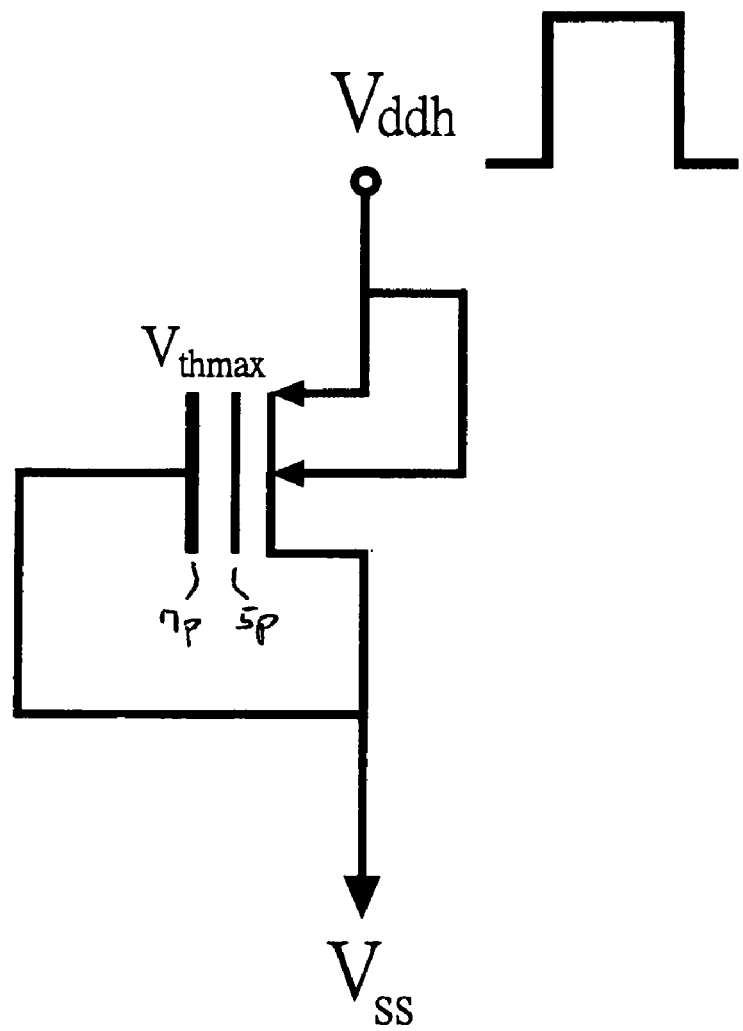
FIG. 15 shows the schematic for another embodiment of a PFET based EEPROM and illustrates a pulse waveform representing its initial programming to the most negative threshold voltage.
Figure 16:
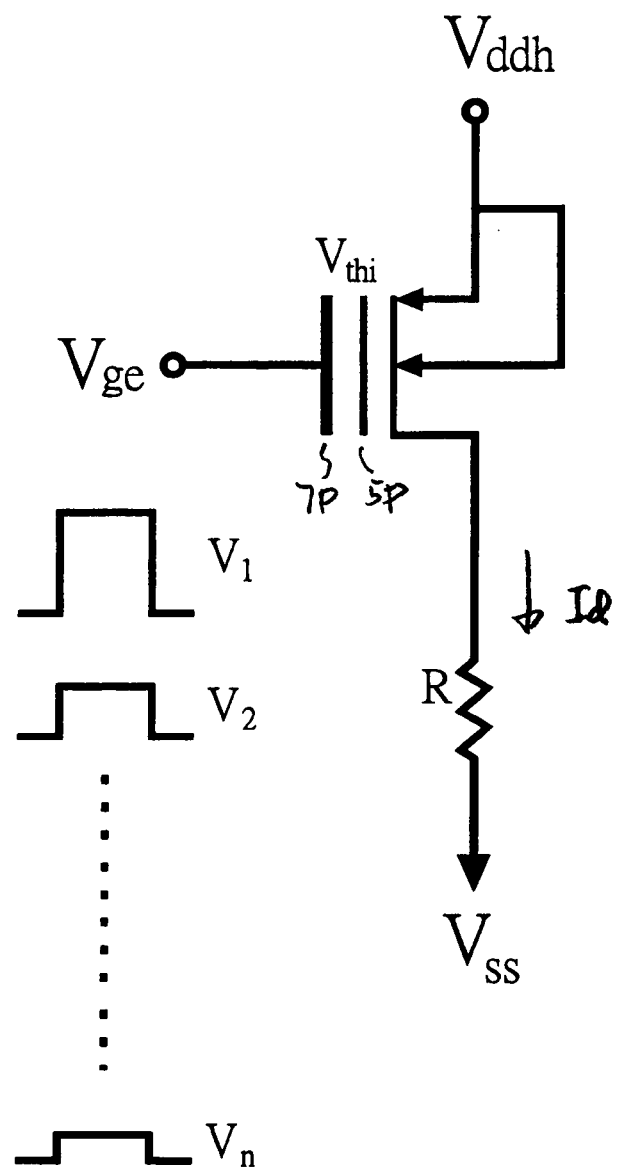
FIG. 16 illustrates the erase-up process by applying different voltage amplitudes on the control gate of a PFET based EEPROM in the embodiment shown in FIG. 15.

FIGS. 15 and 16 show another embodiment of a PFET EEPROM. In the embodiment, the programming process to the most negative threshold voltage is the same as the previous one. PFET EEPROM is initially programmed to the most negative $V_{thmax}$ by applying a high voltage $V_{ddh}$ to the source electrode and the substrate, while the control gate and drain electrode are tied to $V_{ss}$. However, in the erase-up process, instead of switching to a bank of multiple resistors, the PFET EEPROM device is connected to a fixed resistor R (FIG. 16). Gate voltages with different amplitudes are applied to the control gate as shown by pulses $V_1$ to $V_n$ in FIG. 16). PFET EEPROM is erased up to threshold voltage $V_{thi}$ by applying voltage $V_{gei}$ to control gate $7p$, while the drain electrode is connected to the constant resistor R to voltage $V_{ss}$. The amplitudes of the gate voltages represent values of the multi-bits capable of being stored on floating gate $5p$ as shown in the table in FIG. 11.

To enable the erase-up process, the amplitudes of the voltages applied to control gate $7p$ are all low enough to turn on the device. The potential difference between the pinch-off point of the PFET and the drain voltage is $V_d-V_{sat}$ and the vertical potential difference is $V_d-V_f$. The hot electrons injected into the floating gate $5p$ from the depletion region have energy given by the absolute value of $e(V_s-V_{sat})$, and the absolute value of $e(V_d-V_f)$ where e is the electron charge. When the drain voltage $V_d$ is raised to some point such that hot electrons in the depletion region do not have enough energy to flow over the oxide barrier $4p$ (3.1 volts), the number of holes in the floating gate $5p$ remains a constant leading to a specific less negative threshold voltage for the PFET EEPROM device. The drain voltage $V_d$ is given by $V_{ss}+I_dR$ (FIG. 16). For given $V_g$ and R, $I_d$ reaches a maximum steady current when the increase of resistor current $I_d$ resulting in the raised drain voltage balances the increase of device current from rising negative threshold voltage.

A simple schematic for "READ" operation is shown in FIG. 17. The programmed PFET EEPROM device is read by applying a read voltage $V_{gr}$ to the control gate $7p$ with the drain connected through sink resistor R to ground. Each device driving current $I_d$ in response to a different threshold voltage level passes through resistor R to generate the output voltage $V_{outi}$. The distinctive $V_{outi}$ can be compared and converted to the original bit representation as described above in conjunction with FIG. 12.

Figure 18:
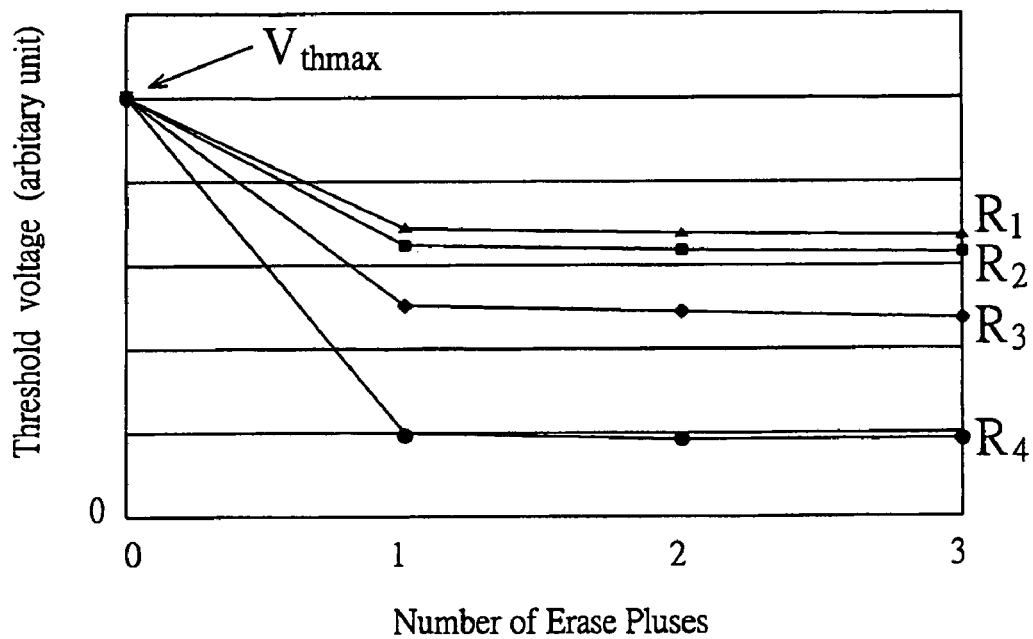
FIG. 18 shows typical steady state threshold voltage curves versus the number of erase voltage pulses applied with different resistor values for an NFET based EEPROM as illustrated in FIG. 7.
Figure 19:
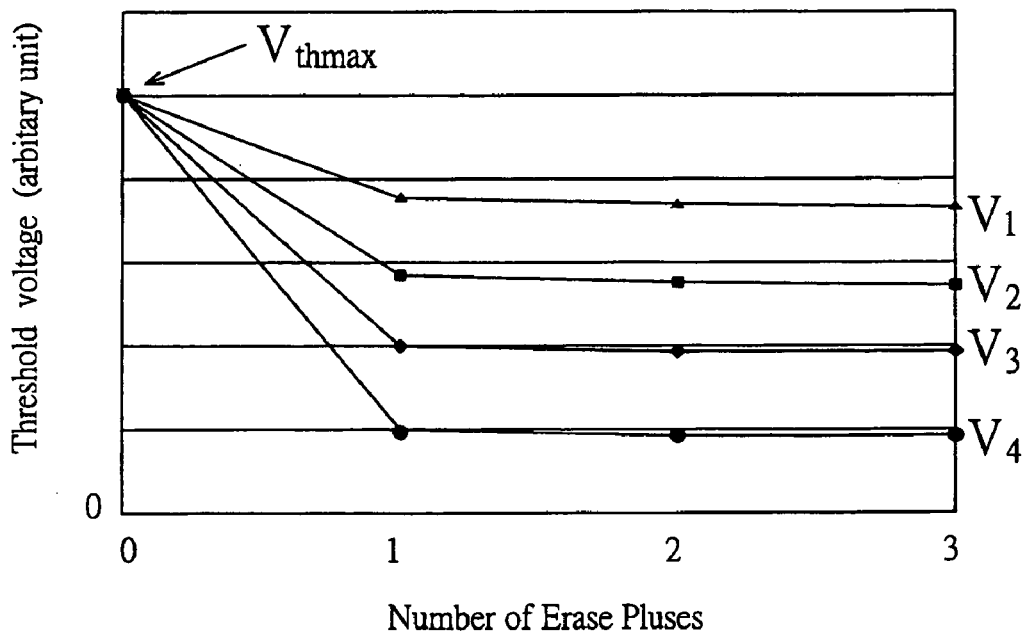
FIG. 19 shows typical steady state threshold voltage curves versus the numbers of erase voltage pulses applied with different applied voltage amplitudes on the control gate for an NFET based EEPROM as illustrated in FIG. 10.

FIGS. 18 and 19 show typical NFET threshold voltage changes versus the number of times of erase-down applied for different resistors and for different control voltage amplitudes, shown in FIG. 7 and FIG. 10, respectively. Note that the threshold voltage of the NFET EEPROM device reaches a constant value after the first erase operation is done. In FIG. 18, the larger the resistor the smaller the maximum drain current and the less the threshold voltage can be down-shifted. In other words, the higher the resistor value, the higher the threshold voltage of the NFET EEPROM. In FIG. 19, the larger the control gate voltage the smaller $V_d-V_{sat}$ ($V_g$). With larger $V_{sat}$, the less the threshold voltage can be down-shifted. In other words, the larger the applied gate voltage amplitude, the higher the threshold voltage of the NFET that can be reached.

Figure 20:
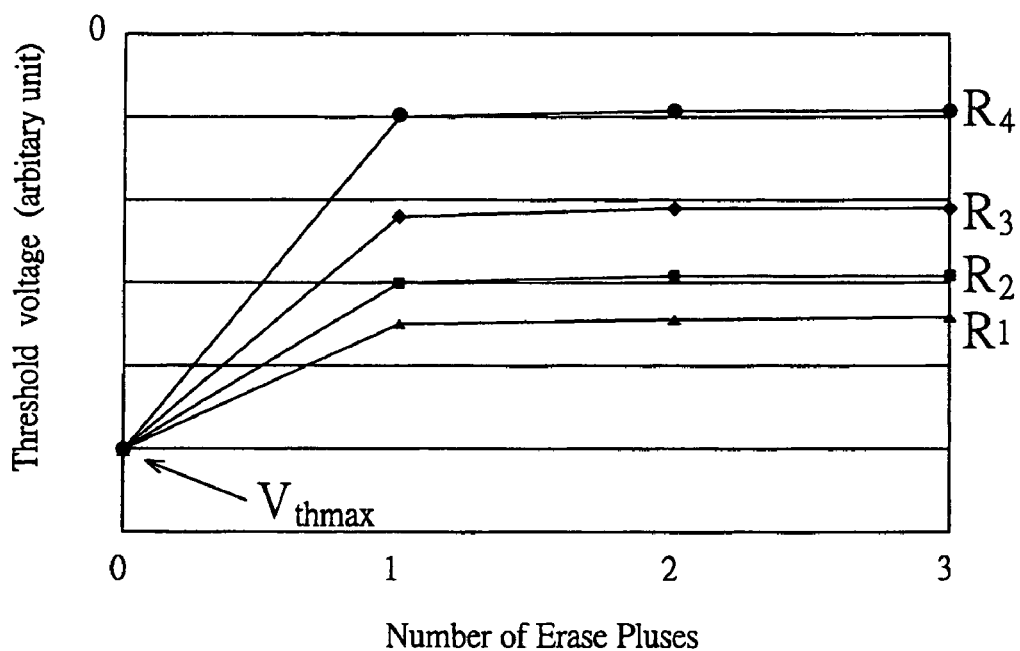
FIG. 20 shows typical steady state threshold voltage curves versus the numbers of erase voltage pulses applied with different resistor values for a PFET based EEPROM as illustrated in FIG. 14.
Figure 21:
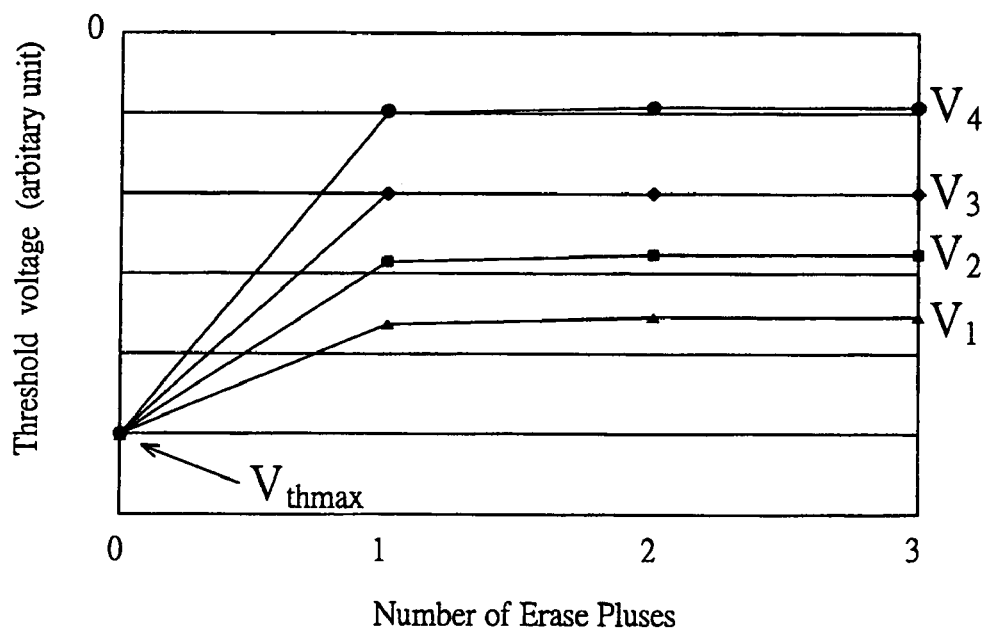
FIG. 21 shows typical steady state threshold voltage curves versus the numbers of erase voltage pulses applied with different amplitudes on the control gate for a PFET based EEPROM as illustrated in FIG. 16.

FIGS. 20 and 21 show typical PFET threshold voltage changes versus number times of erase-up applied for different resistors and for different control voltage amplitudes, shown in FIG. 14 and FIG. 16, respectively. Note that the threshold voltage of the PFET EEPROM device reaches a constant value after the first erase operation is done. In FIG. 20, the larger the resistor the smaller the maximum drain current and the less the threshold voltage can be up-shifted. In other words, the higher the resistor value, the more negative the threshold voltage of the PFET EEPROM which can be reached. In FIG. 21, the more negative the control gate voltage the smaller $V_d-V_{sat}$. This decreases the amount the threshold voltage can be up-shifted. In other words, the more negative the applied voltage amplitude, the more negative the threshold voltage of the PFET that can be reached.

In conclusion, structures and methods are disclosed to achieve multi-bit storage in a single EEPROM cell both for NFET-based and PFET-based nonvolatile memories. The disclosed structures are simple and do not need complicated convergent circuits. With the advantages of larger bit capacity for a single cell and no convergent circuit, the disclosed structures will dramatically reduce the cost per bit for EEPROM capable of storing multi-bit values.

As will be understood by persons skilled in the art, the foregoing preferred embodiment of the present invention is illustrative rather than limiting. Having described the invention in connection with preferred embodiments, modifications will now suggest themselves to those skilled in the art. Thus, the invention is not to be limited to the embodiments described but rather includes various modifications and similar arrangements within the spirit and scope of the appended claims. The scope of the claims should be accorded the broadest interpretation so as to encompass all such modifications and similar structures. While the preferred embodiments of the invention have been illustrated and described, various changes can be made therein without departing from the spirit and scope of the invention.

What is claimed is:

1. A structure for storing in a single nonvolatile memory cell any one of the values capable of being represented by a given number of bits, comprising:
   a nonvolatile memory cell having an FET with a control gate, a source region, and a drain region, and having a resistor one end of which is coupled to said drain region and the other end of which is capable of being coupled to a source of a high voltage; and
   said control gate being capable of being coupled to a source of multiple values of voltages, each of said voltages representing a value of multi-bits to be stored in said nonvolatile memory cell.

2. The structure of claim 1, wherein said nonvolatile memory comprises an NFET based electrically erasable programmable read-only memory (EEPROM).

3. The structure of claim 1, wherein the amplitudes of voltages provided by said source of multiple values of voltages are different.

4. A single nonvolatile memory cell, comprising:
a field effect transistor having a drain, a source, a floating gate and a control gate;
a resistor with a first end and a second end, said first end being coupled to said drain and said second end being capable of being coupled to a source of a low voltage; and
a source of multiple voltage levels capable of being coupled to said control gate for providing a selected voltage representable by multiple-bits to be stored in said nonvolatile memory cell.

5. The structure of claim 4, wherein said nonvolatile memory cell comprises a PFET-based electrically erasable programmable read-only memory (EEPROM).

6. The structure of claim 4, wherein the amplitude of each voltage provided by said source of multiple voltage levels differs from the amplitudes of said other voltages provided by said source.

7. A method for storing information capable of being represented by a multiple bit binary word in a single nonvolatile memory cell, comprising:
programming a nonvolatile memory cell to the highest threshold voltage to which said nonvolatile memory cell can be programmed by applying a high voltage to both a control gate and to a drain electrode of said nonvolatile memory cell; and
erasing down from said highest threshold voltage to a specific threshold voltage by applying a voltage selected from a plurality of different voltages to said control gate by selecting a resistor having an appropriate value of resistance to couple between said drain electrode and a source of said high-voltage.

8. The method of claim 7, wherein said nonvolatile memory cell comprises an NFET-based electrically erasable programmable read-only memory (EEPROM).

9. The method of claim 7, wherein the amplitudes of said voltages are different and vary from a low voltage to said high voltage.

10. A method for storing any one of a plurality of voltages, each voltage capable of being represented by a multiple bit binary word, in a single nonvolatile memory cell having a substrate, a source, a drain, and a control gate, comprising:
programming said nonvolatile memory cell to a most negative threshold voltage by applying a high voltage both to said source and to said substrate; and
erasing up from said most negative threshold voltage to a specific negative threshold voltage level by applying a voltage selected form a plurality of different voltages to said control gate by selecting a resistor having an appropriate value of resistance to couple between said drain electrode and said source of high voltage.

11. The method of claim 10, wherein said nonvolatile memory comprises a PFET-based electrically erasable programmable read-only memory (EEPROM).

12. The method of claim 10, wherein the amplitudes of said voltages are different and vary from a low voltage to said high voltage.

* * * * *